(12) United States Patent
Tominaga et al.

(10) Patent No.: US 10,543,545 B2
(45) Date of Patent: Jan. 28, 2020

(54) METHOD OF INITIALIZING MULTIFERROIC ELEMENT

(71) Applicant: National Institute of Advanced Industrial Science and Technology, Tokyo (JP)

(72) Inventors: Junji Tominaga, Tsukuba (JP); Yuta Saito, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 216 days.

(21) Appl. No.: 15/558,227

(22) PCT Filed: Feb. 22, 2016

(86) PCT No.: PCT/JP2016/055025
§ 371 (c)(1),
(2) Date: Sep. 14, 2017

(87) PCT Pub. No.: WO2016/147802
PCT Pub. Date: Sep. 22, 2016

(65) Prior Publication Data
US 2018/0043448 A1    Feb. 15, 2018

(30) Foreign Application Priority Data
Mar. 16, 2015 (JP) .................. 2015-052645

(51) Int. Cl.
*B21H 5/04* (2006.01)
*H01L 29/82* (2006.01)
(Continued)

(52) U.S. Cl.
CPC .............. *B23H 5/04* (2013.01); *H01L 29/16* (2013.01); *H01L 29/1608* (2013.01); *H01L 29/82* (2013.01)

(58) Field of Classification Search
CPC ....... H01L 29/82; H01L 45/06; H01L 45/126; H01L 45/16; H01L 45/1608;
(Continued)

(56) References Cited

U.S. PATENT DOCUMENTS 8,530,314 B2   9/2013   Tominaga et al.
9,153,315 B2   10/2015  Tominaga et al.
(Continued)

FOREIGN PATENT DOCUMENTS

JP   2010-263131 A   11/2010
JP   4621897         11/2010
(Continued)

OTHER PUBLICATIONS

International Search Report for PCT Serial No. PCT/JP2016/055025 dated May 17, 2016.
(Continued)

*Primary Examiner* — Peter Dungba Vo
*Assistant Examiner* — Joshua D Anderson
(74) *Attorney, Agent, or Firm* — McCormick, Paulding & Huber PLLC

(57) ABSTRACT

A method of initializing a multiferroic element for obtaining a stable element operation includes applying at least one selected from a group consisting of an electric field and a magnetic field to the multiferroic element under a temperature condition equal to or higher than a phase transition temperature. The multiferroic element has a laminated structural body including a first alloy layer and a second alloy layer. The first alloy layer is formed by using any of antimony-tellurium, bismuth-tellurium and bismuth-selenium as a principal component. The second alloy layer is laminated on the first alloy layer, and formed by using a compound represented by the following general formula (1) as a principal component. The second alloy layer is config- (Continued)

ured to undergo phase transition between a reset phase and a set phase. Electric polarization is not caused in the reset phase, but caused in the set phase. The second alloy layer undergoes the phase transition from the reset phase to the set phase at the phase transition temperature.

[Chemical Formula 1]

$$M_{1-x}Te_x \quad (1)$$

Here, in the above-mentioned general formula (1), M represents an atom of any of germanium, aluminum and silicon, and x represents a numerical value of 0.5 or more and lower than 1.

9 Claims, 4 Drawing Sheets

(51) Int. Cl.
  *B23H 5/04* (2006.01)
  *H01L 29/16* (2006.01)
(58) Field of Classification Search
  CPC ............ H01L 45/1616; H01L 45/1625; H01L 45/144; G11C 11/15; G11C 11/22; G11C 13/0002; G11C 13/0004
  See application file for complete search history.

(56) References Cited

U.S. PATENT DOCUMENTS

| 2010/0200828 | A1 | 8/2010 | Tominaga et al. |
| 2010/0284218 | A1 | 11/2010 | Aizawa et al. |
| 2011/0207284 | A1 | 8/2011 | Tominaga et al. |
| 2013/0279247 | A1 | 10/2013 | Tominaga et al. |
| 2014/0151622 | A1 | 6/2014 | Oyanagi et al. |
| 2014/0376307 | A1 | 12/2014 | Shintani et al. |

FOREIGN PATENT DOCUMENTS

| JP | 4635236 | | 12/2010 |
| JP | 2013-51245 | A | 3/2013 |
| JP | 2014-107528 | A | 6/2014 |
| JP | 2015-5600 | A | 1/2015 |
| JP | 2015-35478 | A | 2/2015 |
| WO | 2013/125101 | A1 | 8/2013 |

OTHER PUBLICATIONS

Article entitled: Topological insulators in Bi2Se3, Bi2Te3 and Sb2Te3 with a single Dirac cone on the surface; H. Zhang et al., Nature Physics, 5, 438 (2009).

Article entitled: Observation of a large-gap topological-insulator class with a single Dirac cone on the surface; Y. Xia et al., Nature Physics, 5, 398 (2009).

Article entitled: Interfacial phase-change memory; J. Tominaga et al., Nature Nanotechnology, 6, 501 (2011).

Article entitled: Electrical-field induced giant magnetoresistivity in (non-magnetic) phase change films; J. Tominaga et al., Applied Physics Letter, 99, 152105 (2011).

Article entitled: Giant multiferroic effects in topological GeTeSb2Te3 superlattices; J. Tominaga et al., Sci. Technol. Adv. Mater. 16, 014402 (2015).

T. Arima, Fronriers in Physics 2, "Multiferroics, New Development of Electromagnetics in Material" and a partial English translation thereof.

METHOD OF INITIALIZING MULTIFERROIC ELEMENT

CROSS-REFERENCE TO RELATED APPLICATIONS

This application is a National Stage application of International Patent Application No. PCT/JP2016/055025, filed on Feb. 22, 2016, which claims priority to Japanese Patent Application Number 2015-052645, filed on Mar. 16, 2015, each of which is hereby incorporated by reference in its entirety.

TECHNICAL FIELD

The present invention relates to a method of initializing a multiferroic element. The method is to be carried out in advance before an operation of the element is carried out.

BACKGROUND ART

A computer, which supports modern civilization, operates by means of an electrical current, which is a flow of electrons. An electronic device in which this electrical current is operated and applied to recording and/or erasing information is constituted by a semiconductor. The electrons that flow in the semiconductor are scattered by impurities and Coulomb force, and thus generate Joule heat.

For this reason, a computer requires a fan for cooling. Further, a part of an input energy cannot be utilized for recording and erasing information due to the Joule heat mentioned above, and energy loss thus occurs. Namely, there can be no doubt that suppression of the scattering of electrons is a major technical development achieved for power saving of the electronic device mentioned above.

As one solution, there has been a method of suppressing the scattering mentioned above of electrons conventionally by operating the electronic device mentioned above at an extremely low temperature. For example, use of a superconductor corresponds to such a method. Since scattering of electrons becomes zero in the superconductor mentioned above, there is no electrical resistance, and no Joule heat is generated. Therefore, the above-mentioned scattering of electrons does not occur.

However, in a case where this method is used, it is necessary to cool the electronic device to a temperature of several Kelvins, and an energy consumed for this purpose cannot be neglected. Further, it is difficult to generalize an electronic device utilizing such an extremely low temperature state and put this electronic device into practical use. Therefore, under the current situation, there is no satisfactory one as means capable of suppressing the scattering of electrons at a room temperature.

However, the situation has been changing since around 2007. This is because a theoretical prediction of a topological insulator was suggested as a physical theory. The topological insulator is an insulator in which a special electronic state that occurs only on a surface or an interface of an object is utilized, and is explained based on a relativistic effect that occurs due to the relativistic velocity close to light of inner-shell electrons of a relatively heavy chemical element.

Namely, by this effect of electrons (a spin-orbit interaction), an energy term of a spin-orbit interaction is added to the Hamiltonian of a band structure formed by the electrons, and a change in band structures and energy-inherent values occurs. At this time, in a certain substance, the uppermost band of a valence band at a vacuum surface is connected to the lowermost band of a conduction band, whereas a band gap opens in the bulk state.

As a result, a special physical property that has not been known until now appears. The physical property is such that the substance becomes a conductor on a surface or at interfaces thereof, whereas the bulk becomes an insulator. A substance having such a property is referred to as "topological insulator" (see H. Zhang et al. Nature Physics, 5, 438 (2009)).

A special electron band structure possessed by the topological insulator mentioned above has a non-trivial characteristic that the electrons present on the surface or at interfaces of the substance are divided into two electron spin flows each having a different spin due to time reversal symmetry and the electrons continuously flow without application of any electric field. In other words, this is the same as a fact that the topological insulator has an important property in which the topological insulator does not undergo the scattering mentioned above of electrons due to the impurities and the like. Further, for example, in a case where there is no external magnetic field that breaks the time reversal symmetry mentioned above, this property is kept very strongly. The name of the above-mentioned topological insulator is derived from a fact that such a property possessed by the electron band structure has a similar property to that of the topology phase theory of mathematics (see H. Zhang et al. Nature Physics, 5, 438 (2009)).

After the presence of the topological insulator mentioned above has been predicted in theory, a search for materials that actually have this non-trivial property was started. As a result, bismuth-tellurium alloys, antimony-tellurium alloys, and the like, which have high crystallinity, were confirmed by experiments by means of photoelectron spectroscopy. However, the single crystals used in these experiments were manufactured by a method of cooling a molten alloy or the like, and cannot be directly applied to the electronic device mentioned above (see Y. Xia et al. Nature Physics, 5, 398 (2009)).

On the other hand, the present inventors suggested a superlattice-type phase change solid-state memory without any relation to the topological insulator mentioned above in order to decrease an electrical power consumed by a phase change type solid-state memory. The superlattice-type phase change solid-state memory has a superlattice-type phase change film formed by laminating crystal alloy layers formed of antimony-tellurium and crystal alloy layers formed of germanium-tellurium so as to share the (111) plane axes and the c axes possessed by the respective crystal alloy layers. In the superlattice-type phase change solid-state memory, memory operations are possible by switching an array structure of the germanium atoms in an axis direction of crystal growth (see Japanese Patent No. 4,621,897 and Japanese Patent No. 4,635,236, and Tominaga et al. Nature Nanotechnology, 6, 501 (2011) and J. Tominaga et al. Applied Physics Letter, 99, 152105 (2011)).

Further, the present inventors provided a spin memory that can accumulate spin flows generated by injecting electrons thereinto while applying an electric field in a vertical direction, by utilizing that a superlattice-type phase change solid-state memory can be an ideal topological insulator (see International Patent Publication No. 2013/125101).

In addition, the present inventors suggested a transistor that is configured to apply a voltage by using a superlattice structure possessed by a superlattice-type phase change solid-state memory as a gate to control an electrical current (spin flow) that flows in the plane of the superlattice structure (see Japanese Patent Application Publication No. 2015-35478).

A superlattice structure, in which crystal alloy layers each having a ratio of antimony atoms to tellurium atoms of 2:3 and having aligned crystalline orientation (hereinafter, referred to also as "$Sb_2Te_3$ layers") and crystal alloy layers formed of germanium atoms and tellurium atoms and having aligned crystalline orientation (hereinafter, referred to also as "GeTe layers") are repeatedly laminated, is constituted by two different crystal forms (phases) called as a set phase and a reset phase (see J. Tominaga et al. Sci. Technol. Adv. Mater. 16, 014402 (2015)).

Since the reset phase mentioned above has two properties including space reversal symmetry and time reversal symmetry, each spin band degenerates and does not have magnetism.

The set phase mentioned above loses the space reversal symmetry because one of a pair of germanium atoms inverts to a side of a $Sb_2Te_3$ layer. However, since the time reversal symmetry is maintained, a spin split band called as a Rashba effect is formed.

In this split band, a formula "E (k, down spin)=E (−k, up spin)" is established from a conservation law of the time reversal symmetry at a band space made by energy (E)—momentum (k), and thus the split band cannot freely have a spin state. Namely, the scattering of electrons is significantly limited.

Further, since the band is spin-split in a state of the set phase in the GeTe layer mentioned above, the band is magnetized when an external magnetic field is applied thereto. Moreover, a magnetic moment is generated when an electric field is applied thereto. Conversely, an electric field is generated when a magnetic field is applied thereto.

Namely, the superlattice structure mentioned above simultaneously has an electric dipole and a magnetic moment such that a magnetic moment is generated when an electric field is applied thereto and an electric field is generated when a magnetic field is applied thereto. A property of simultaneously having both an electric dipole and a magnetic moment is called as multiferroic.

As materials that exert the multiferroic, one that exerts at an extremely low temperature is known (see Takahisa Arima, Multiferroics New development of electromagnetics in material (2014)). Since the superlattice structure mentioned above exerts the multiferroic under a temperature condition at a room temperature or higher, it can say that the superlattice structure is a highly practical multiferroic material.

SUMMARY

In the subsequent researches, when the spin memories and transistors (multiferroic elements) having a multiferroic function, which have been provided by the present inventors until now, were operated, elements that functioned as expected and elements that did not function even having the same structure were confirmed. Therefore, a method of stably operating a multiferroic element is required.

In order to solve such a problem, the present inventors made intensive studies, and obtained the following knowledge.

Namely, each of the layers that constitutes the superlattice structure mentioned above is a film formed at a high temperature of 200° C. to 250° C., and most of the layers undergo phase transition from the set phase to the reset phase during a process of cooling from a film formation temperature to a room temperature. This is because the reset phase is more stable in terms of thermodynamics at a temperature of 150° C. or lower. However, in a case where the velocity of cooling is fast, then the set phase also remains in the GeTe layer mentioned above.

In the GeTe layer, which is deemed as the set phase, for example, when the molecular bonds between the germanium atoms and the tellurium atoms are expressed by bending the bonds up and down, it is thermodynamically allowed that the same amount of first set phases and the same amount of second set phases can exist at the same time. Each of the first set phases can be expressed as—germanium (down)—tellurium (up)—germanium (down)—tellurium (up)—. Each of the second set phases can be expressed as—germanium (up)—tellurium (down)—germanium (up)—tellurium (down)—by reversing a vertical relationship of the first set phase mentioned above.

Here, the germanium atoms are slightly positively charged. Conversely, the tellurium atoms that form a counterpart to the germanium atoms are negatively charged. Therefore, in a case where the set phase is constituted by either the first set phase or the second set phase, the set phase can exert and develop electronic polarization as a ferroelectric.

However, in a case where both of the first set phase and the second set phase remain in the reset phase mentioned above and phase transition from the reset phase to the set phase occurs, the two types of set phases as mentioned above are generated by using these remaining first set phase and second set phase mentioned above as nuclei. The electric dipoles of the first and second set phases are cancelled each other, and the ferroelectricity as a whole thus decreases.

This cancellation of the electric dipoles can be solved by initializing the first and second set phases, which remained in the reset phase as a low temperature phase and served as the nuclei for forming the set phases mentioned above, so that the set phases are unified to any one of the set phases. The present inventors obtained the knowledge that: the first and second set phases can be initialized in advance so that the first and second set phases are unified to any one of the set phases by applying at least one selected from a group consisting of an electric field and a magnetic field to the superlattice structure mentioned above under a temperature state of 150° C. or higher, which is the phase transition temperature between the set phase and the reset phase; as a result, significant electric polarization can be exerted in the multiferroic element having the superlattice structure by suppressing the cancellation of the electric dipoles; and ferromagnetism having a magnetic moment in a certain direction can also be exerted by estrangement of the degeneration of the spin band mentioned above.

It is an object of the present invention to solve the problems mentioned above, in the conventional technologies, and to provide a method of initializing a multiferroic element so as to obtain a stable element operation.

The present invention is based on the knowledge mentioned above, and means for solving the problems are as follows:

A first method of initializing a multiferroic element, the multiferroic element having a laminated structural body, the laminated structural body including a first alloy layer and a second alloy layer, the first alloy layer being formed by using any of antimony-tellurium, bismuth-tellurium and bismuth-selenium as a principal component, the second alloy layer being laminated on the first alloy layer, the second alloy layer being formed by using a compound represented by the following general formula (1) as a principal component, the second alloy layer being configured to undergo phase transition between a reset phase and a set phase, electric polarization being not caused in the reset phase, the electric polarization being caused in the set phase, the method including:

applying at least one selected from a group consisting of an electric field and a magnetic field to the multiferroic element under a temperature condition equal to or higher than a phase transition temperature, the second alloy layer undergoing the phase transition from the reset phase to the set phase at the phase transition temperature:
[Chemical Formula 1]

$$M_{1-x}Te_x \quad (1)$$

wherein in the above-mentioned general formula (1), M represents an atom of any of germanium, aluminum and silicon, and x represents a numerical value of 0.5 or more and lower than 1.

A second method of initializing a multiferroic element according to the first method, wherein the multiferroic element has a superlattice structure in which first alloy layers and second alloy layers are alternately laminated, each of the first alloy layers being formed by using any of compounds $Sb_2Te_3$, $Bi_2Te_3$ and $Bi_2Se_3$ each of which has an atomic composition ratio of 2:3 as a principal component among antimony-tellurium, bismuth-tellurium and bismuth-selenium, a crystalline orientation being oriented in a predetermined orientation in each of the first alloy layers, each of the second alloy layers being formed by using any of compounds germanium-tellurium and silicon-tellurium as a principal component, a crystalline orientation being oriented in a predetermined orientation in each of the second alloy layers.

A third method of initializing a multiferroic element according to any of and the first and second methods, wherein a voltage in one direction is applied between an upper electrode and a lower electrode with respect to a laminated structural body and an external magnetic field is applied to a lamination direction, the upper electrode and the lower electrode being disposed at upper and lower positions of the laminated structural body in the lamination direction.

A fourth method of initializing a multiferroic element according to any of the first and second methods, wherein a voltage is applied between a first electrode and a second electrode having magnetism with respect to a laminated structural body and an external magnetic field is applied to a lamination direction, the first electrode and the second electrode being disposed on one surface of the laminated structural body.

A fifth method of initializing a multiferroic element according to the fourth method, wherein a voltage is applied to any of between the first electrode and the second electrode and between a third electrode and the second electrode with respect to the laminated structural body and an external magnetic field is applied in the lamination direction, the third electrode being further disposed on the one surface at a position opposite to the first electrode when seen from the second electrode.

A sixth method of initializing a multiferroic element according to any of the third, fourth, and fifth methods, wherein a voltage of 0.25 V or less per 1 nm of a thickness in the lamination direction of the laminated structural body is applied.

A seventh method of initializing a multiferroic element according to any of the first, second, third, fourth, fifth, and sixth methods, wherein an external magnetic field having a magnitude of 5.0 T or less is applied.

An eighth method of initializing a multiferroic element according to any of the first, second, third, fourth, fifth, sixth and seventh methods.

wherein at least one selected from the group consisting of the electric field and the magnetic field is applied under a temperature condition lower than melting points of the compounds constituting the first alloy layer and the second alloy layer.

According to the present invention, it is possible to solve the problems mentioned above in the conventional technologies, and to provide a method of initializing a multiferroic element so as to obtain a stable element operation.

DETAILED DESCRIPTION

Figure 1:
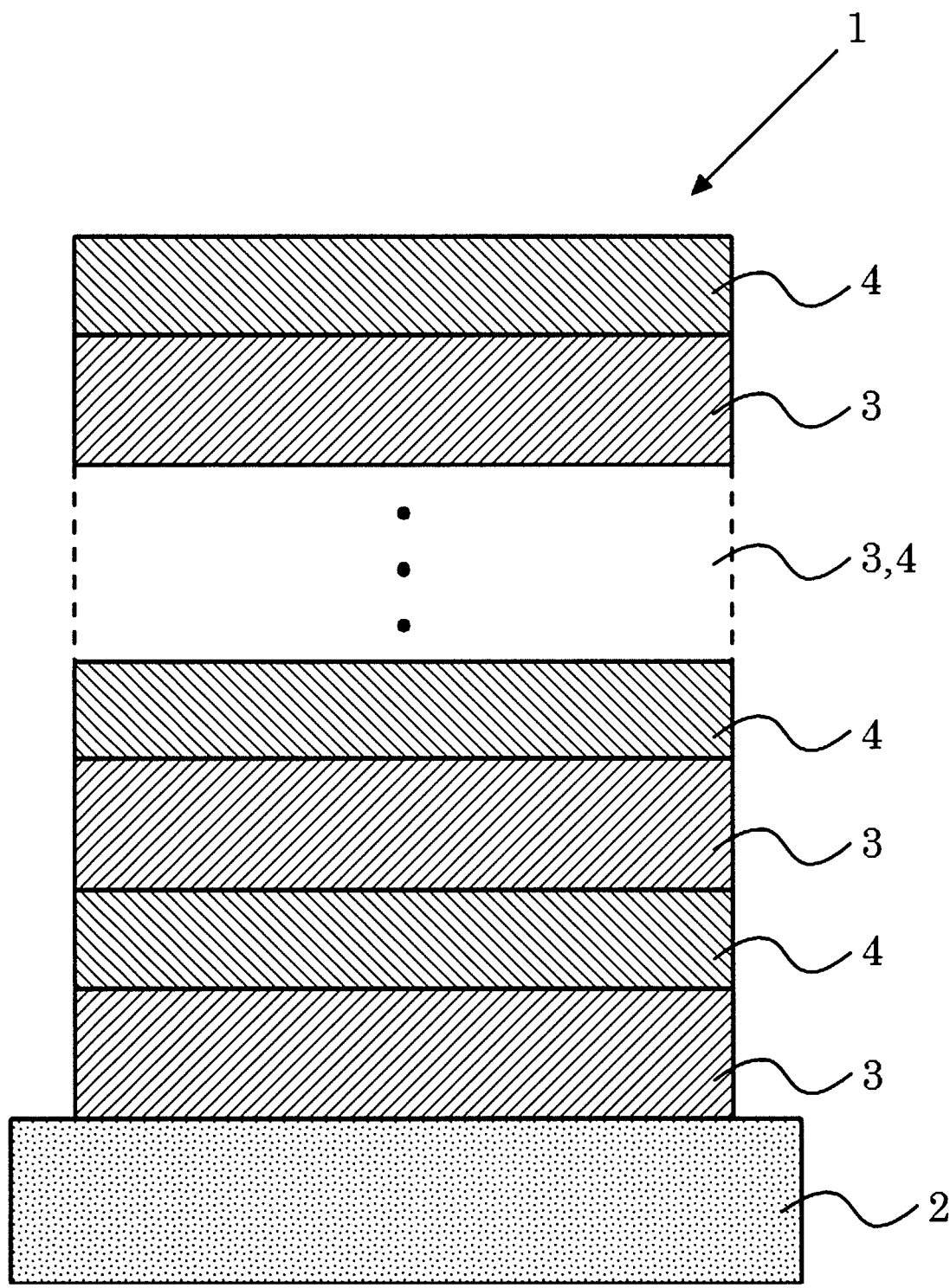
FIG. 1 is a cross-sectional view showing a configuration example of a laminated structural body.

First, a multiferroic element that is a target to be initialized will be described.

The multiferroic element has a laminated structural body that includes a first alloy layer, and a second alloy layer laminated on the first alloy layer.

The first alloy layer is a layer formed by using any of antimony-tellurium, bismuth-tellurium and bismuth-selenium as a principal component. A layer formed by using any of compounds Sb2Te3, Bi2Te3 and Bi2Se3 each of Which has an atomic composition ratio of 2:3 can preferably be exemplified among antimony-tellurium, bismuth-tellurium and bismuth-selenium.

Further, a thickness of the first alloy layer is set to 2 nm or more and 10 nm or less.

The first alloy layer formed in this way acts as a topological insulator as mentioned above.

In the present specification, the word "principal component" refers to an element that forms a basic unit lattice of a layer.

The first alloy layer is not limited particularly. However, it is preferable that the first alloy layer is a layer having a crystalline orientation that is oriented in a predetermined orientation, and more specifically, it is more preferable that the first alloy layer has a hexagonal crystal structure and in which a c axis is oriented in a lamination direction thereof.

In a case where the first alloy layer has such a crystal structure, a layer that is to be laminated thereon subsequently serves as a template for generating orientation by using this layer as a foundation, and a superlattice structure of a laminate of these layers can thus be obtained easily.

A method of forming the first alloy layer is not limited particularly. However, since the crystal structure in the c axis orientation can easily be obtained, it is preferable that the method is a sputtering method, a molecular beam epitaxy method, an ALD (Atomic Layer Deposition) method, a CVD (Chemical Vapor Deposition) method and the like, for example.

The second alloy layer is formed by using a compound represented by the following general formula (1) as a principal component.

This second alloy layer is configured to allow phase transition between a reset phase and a set phase depending upon disposition of M. The reset phase has space reversal symmetry on the center of the layer, and electric polarization does not occur in the reset phase. In the set phase, the space reversal symmetry is broken and the electric polarization thus occurs. The reset phase does not have a magnetic property of a ferromagnetic body, whereas the set phase has the magnetic property of the ferromagnetic body.

[Chemical Formula 2]

$$M_{1-x}Te_x \qquad (1)$$

Here, in the general formula (1), M represents an atom of any of germanium, aluminum and silicon, and x represents a numerical value of 0.5 or more and lower than 1.

As the alloy represented by the general formula (1) mentioned above, GeTe is preferable in view of the magnitude of a dielectric constant thereof.

A thickness of the second alloy layer is not limited particularly. However, it is preferable that the thickness is more than 0 nm and 4 nm or less. If the thickness is more than 4 nm, independent and inherent properties are sometimes shown, and a property of the laminated structural body with respect to the first alloy layer may be affected.

The second alloy layer is not limited particularly. However, it is preferable that the second alloy layer is a layer having a crystalline orientation that is oriented in a predetermined orientation. It is more preferable that the second alloy layer has a cubic crystal structure and a (111) plane thereof is disposed on a surface adjacent to the first alloy layer. More specifically, it is preferable that the second alloy layer has a face-centered cubic crystal structure and a (111) plane thereof is disposed on the surface adjacent to the first alloy layer.

In a case where the second alloy layer has such a crystal structure, a layer that is to be laminated thereon subsequently serves as a template for generating orientation by using this layer as a foundation, and a superlattice structure of a laminate of these layers can thus be obtained easily.

A method of forming the second alloy layer is not limited particularly. However, since the crystal structure in the c axis orientation can easily be obtained, it is preferable that the method is a sputtering method, a molecular beam epitaxy method, an ALD method, a CVD method and the like, for example.

A configuration example of the laminated structural body described above is shown in FIG. 1. FIG. 1 is a cross-sectional view showing a configuration example of the laminated structural body.

A laminated structural body 1 has a superlattice structure in which first alloy layers ($Sb_2Te_3$ layer) 3 of $Sb_2Te_3$ and second alloy layers (GeTe layer) 4 of GeTe are alternately laminated on a suitable substrate 2, for example. Crystalline orientation is oriented in a predetermined orientation in each of the first alloy layers. Crystalline orientation is oriented in a predetermined orientation in each of the second alloy layers. In FIG. 1, a portion represented by the reference numeral "3, 4" denotes repetition in the laminate structure in which the first alloy layers 3 and the second alloy layers 4 are alternately laminated.

In the laminated structural body 1 formed in this manner, the reset phase described above in the second alloy layer 4 is configured to allow phase transition to the set phase described above by applying a relatively weak voltage to the reset phase, for example. On the other hand, the set phase is configured to allow phase transition to the reset phase by applying a relatively strong voltage to the set phase, for example. By utilizing these properties, an element operation as a multiferroic element is expected.

Here, in the second alloy layer 4, the set phase that cannot undergo phase transition to the reset phase remains in a cooling process after the laminated structural body 1 has been manufactured at a high temperature at the time of the manufacture. The present inventors obtained the knowledge that two phases having different directions of electric polarization such as an upward first set phase and a downward second set phase with respect to the lamination direction of the laminated structural body 1 may further be exerted in this set phase. In a case where the first set phase and the second set phase are present together, the electric dipoles of the first set phase and the second set phase are cancelled during the phase transition of the reset phase to the set phase at the time of the element operation, and the phase transition of the reset phase to the set phase is thus inhibited.

These respective phases will be explained more specifically while referring to FIGS. 2(a) to 2(c). In this regard, FIG. 2(a) is an explanatory drawing showing a situation when the second alloy layer is a reset phase, FIG. 2(b) is an explanatory drawing showing a situation when the second alloy layer is a first set phase, and FIG. 2(c) is an explanatory drawing showing a situation when the second alloy layer is a second set phase.

Figure 2A:
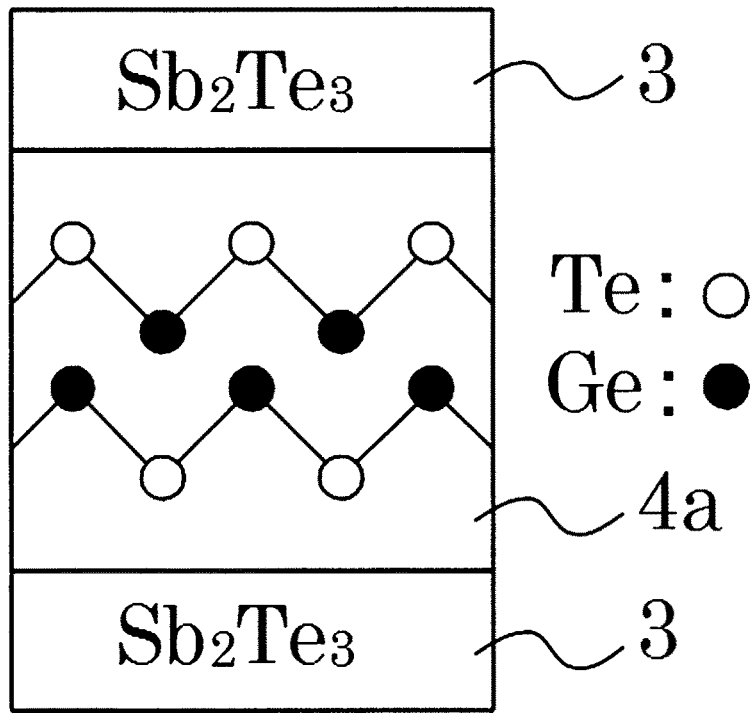
FIG. 2(a) is an explanatory drawing showing a situation when a second alloy layer is a reset phase.

First, as shown as a reference numeral 4a in FIG. 2(a), the reset phase described above becomes a state where Ge atoms that are positively charged and Te atoms that are negatively charged are positioned between two bonds of Ge—Te so as to face each other and electric polarization does not occur in the second alloy layer 4.

Figure 2B:
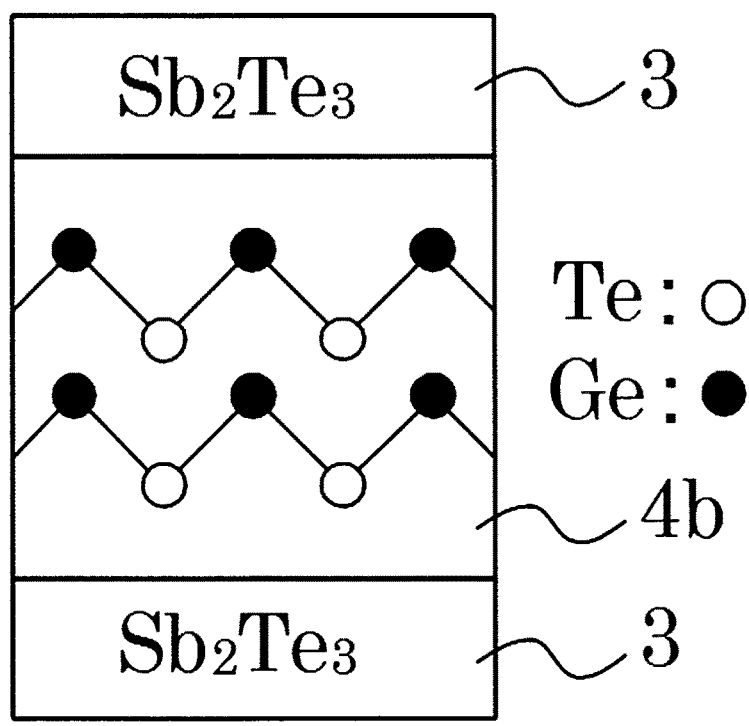
FIG. 2(b) is an explanatory drawing showing a situation when the second alloy layer is a first set phase.

Next, as shown as a reference numeral 4b in FIG. 2(b), the first set phase described above becomes a state where the Ge atoms that are positively charged and the Te atoms that are negatively charged are positioned between the two bonds of Ge—Te so as to face each other and electric polarization occurs in the second alloy layer 4 so that an upper side of the second alloy layer 4 is positively charged and a lower side thereof is negatively charged in FIG. 2(b).

Figure 2C:
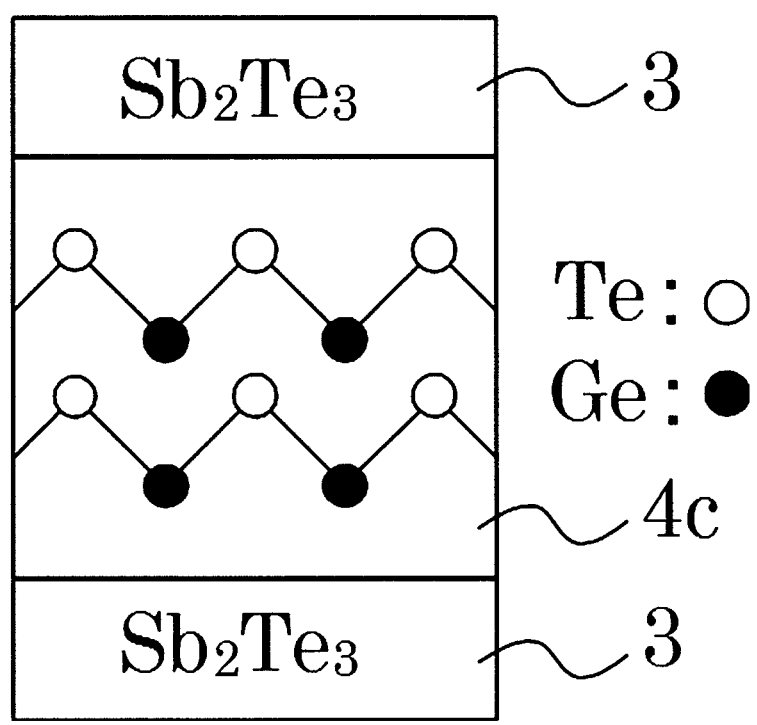
FIG. 2(c) is an explanatory drawing showing a situation when the second alloy layer is a second set phase.

Next, as shown as a reference numeral 4c in FIG. 2(c), the second set phase described above becomes a state where the Ge atoms that are positively charged and the Te atoms that are negatively charged are positioned between the two bonds of Ge—Te so as to face each other and electric polarization occurs in the second alloy layer 4 so that the upper side of the second alloy layer 4 is negatively charged and the lower side thereof is positively charged in FIG. 2(c). Namely, in the second set phase, the direction of the electric polarization is in a state where it is inverted from the first set phase.

For that reason, in order to stably exert the element operation expected in the multiferroic element described above, it is important to manufacture the laminated structural body 1 at a high temperature, and then initialize the laminated structural body 1 by in advance unifying a direction of the electric polarization possessed by each of nuclei in the set phase, which could not undergo the phase transition during the cooling process, in one direction, for example, either upward or downward with respect to the lamination direction.

In the present specification, the word "initialize (or initialization)" means that the first set phase and the second set phase that are present together in the reset phase of the second alloy layer are unified to any one phase of the first set phase and the second set phase.

Once the initialization is carried out, phase transition between the reset phase and the set phase can occur at the time of the element operation in a state where the set phases are unified to any one phase of the first set phase and the second set phase. This makes it possible to allow the multiferroic element described above, which utilizes this phase transition phenomenon, to carry out a stable element operation.

Further, it is known that the reset phase has a larger electrical resistance than that of the set phase (see Tominaga et al. Nature Nanotechnology, 6, 501 (2011) and J. Tominaga et al. Applied Physics Letter, 99, 152105 (2011) listed above), and a state of the phases in the second alloy layer can be confirmed by measuring the electrical resistances thereof and comparing the magnitudes thereof.

The initialization described above can be carried out by applying at least one selected from a group consisting of an electric field and a magnetic field to the laminated structural body 1 under a temperature condition equal to or higher than a phase transition temperature at which phase transition from the reset phase to the set phase in the second alloy layer occurs. In particular, it is preferable to apply both of the electric field and the magnetic field to the laminated structural body 1 in order to effectively suppress generation of the set phase that inverts.

Further, the initialization described above is not limited particularly. For example, the initialization may be carried out either at the stage before shipment of the multiferroic element or after the shipment. However, during the manufacture of the laminated structural body before shipment, it is preferable to conduct cooling while applying the electric field and the magnetic field to the laminated structural body, which is in a high temperature state equal to or higher than the phase transition temperature immediately after the film formation.

The method of applying the electric field thereto is not limited particularly. An external electric field may be applied thereto, or a voltage may be applied thereto by attaching electrodes to the laminated structural body.

Regarding the latter, examples of the method include: (1) a method in which a voltage in one direction is applied between an upper electrode and a lower electrode with respect to the laminated structural body on which the upper electrode and the lower electrode are respectively disposed at upper and lower positions of the lamination direction; (2) a method in which a voltage in one direction is applied to the laminated structural body between two electrodes that are disposed on one surface thereof; (3) a method in which a voltage is applied to the laminated structural body between a first electrode and a second electrode having magnetism that are disposed on one surface thereof; (4) a method in which a voltage is applied to the laminated structural body between the first electrode and the second electrode or between the second electrode and a third electrode that is further disposed on the one surface thereof at a position opposite to the first electrode seen from the second electrode; and the like.

In this regard, regarding the method of the (1) described above, the upper electrode and the lower electrode may be disposed in the laminated structural body as electrode layers instead of the upper and lower surfaces of the laminated structural body. Further, regarding the methods of the (1) to (4) described above, the voltage may be applied by utilizing electrodes that have been formed for the multiferroic element.

Regarding the methods of the (1) to (4) described above for applying a voltage between the electrodes, the magnitude of the applied voltage is not limited particularly. However, if the voltage is too high, the laminated structural body may be melting and lose a multiferroic function. Therefore, it is preferable that the voltage is 0.25 V or lower per 1 nm of the thickness in the lamination direction of the laminated structural body, and is optimally about 0.1 V. For example, in a case where the thickness of the laminated structural body in the lamination direction is 20 nm, it is preferable that the voltage is 5.0 V or lower, and optimally about 2.0 V.

In this regard, a lower limit of the magnitude of the applied voltage is about 0.1 V.

The method of applying the magnetic field thereto is not limited particularly. A method in which an external magnetic field is applied to the laminated structural body by disposing a known external magnetic field generator unit, and the like are exemplified.

It is preferable that the external magnetic field is applied in the lamination direction of the laminated structural body.

Further, the magnitude of the external magnetic field is not limited particularly. However, it is preferable that the magnitude is 5.0 T or lower, and it is more preferably between 0.1 T to 1 T. In a case where the magnitude of the external magnetic field exceeds 5.0 T, residual magnetization in the laminated structural body becomes larger, and the set phase may not be returned to the reset phase easily.

In this regard, the temperature condition is not limited particularly so long as it is the phase transition temperature of the second alloy layer or higher. In a case where the second alloy layer is formed by GeTe, it is about 150° C. or higher. However, as an upper limit thereof, it is necessary to set the temperature condition to be lower than melting points of compounds that respectively constitute the first alloy layer and the second alloy layer.

Further, the phase transition between the reset phase and the set phase occurs by applying a temperature change at the time of the initialization, applying a voltage at the time of the element operation, and the like. Namely, the phase transition occurs by not only the temperature change but also a change in an electric field or a magnetic field, and the like. In the present specification, the word "phase transition temperature" means a temperature at which phase transition occurs between the reset phase and the set phase in a state where any phase transition condition such as an electric field or a magnetic field is not applied. In the method of initializing the multiferroic element according to the present invention, the laminated structural body is put into a state where the set phase is dominant in the second alloy layer by putting the laminated structural body under a temperature condition equal to or higher than the phase transition temperature, and the first set phase and the second set phase included in the set phase are unified to any one phase of the first set phase and the second set phase by applying at least one selected from the group consisting of the electric field and the magnetic field to the laminated structural body in this state.

An example of the initializing methods described above will be described while referring to the drawings.

In the method of the (1) described above, the method can be carried out by disposing electrodes on the upper and lower surfaces of the laminated structural body 1 shown in FIG. 1.

Figure 3:
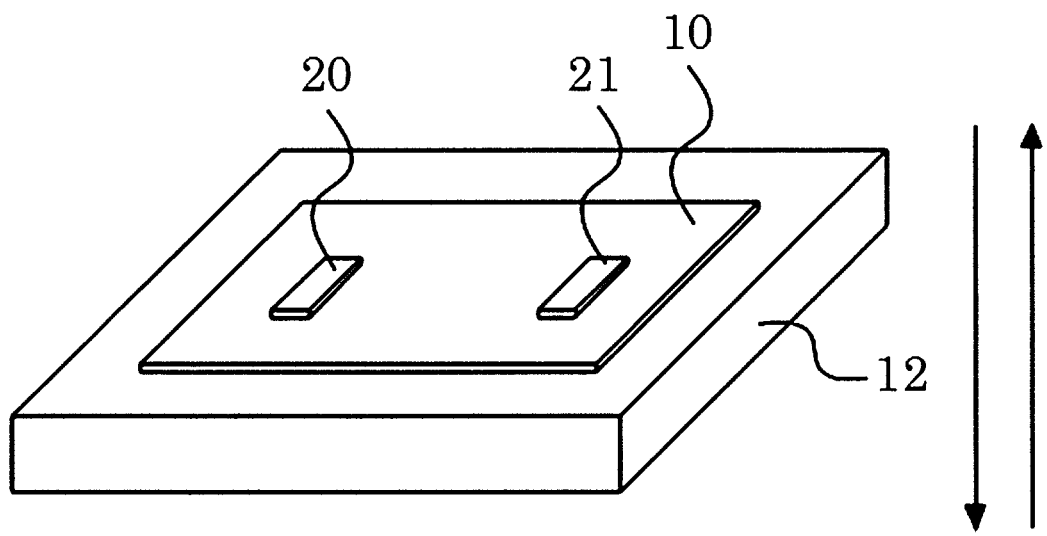
FIG. 3 is an explanatory drawing explaining a situation while the initializing method is carried out.

Further, in the method of the (2) described above, as shown in FIG. 3, the method can be carried out by disposing two electrodes 20 and 21 on one surface of a laminated structural body 10 formed on a substrate 12. FIG. 3 is an explanatory drawing explaining a situation while the initializing method is carried out. Arrows in FIG. 3 denote directions of the application of the external magnetic field, and the direction may be either upward or downward in FIG. 3.

Figure 4:
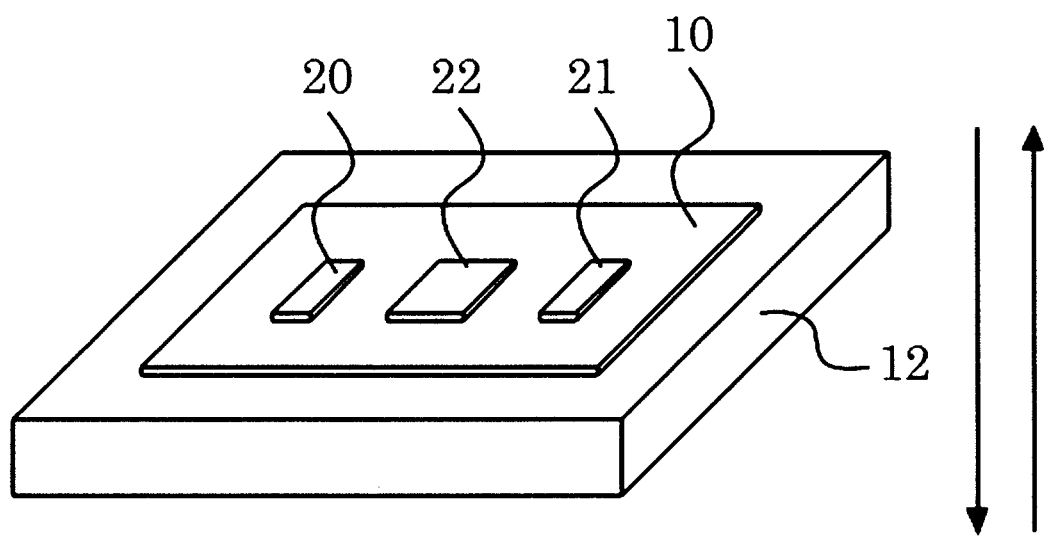
FIG. 4 is an explanatory drawing for explaining another situation while the initializing method is carried out.

Further, in the method of the (3) described above, as shown in FIG. 4, the method can be carried out by disposing an electrode 20 and an electrode having magnetism 22 on one surface. FIG. 4 is an explanatory drawing for explaining another situation while the initializing method is carried out. Arrows in FIG. 4 denote directions of the application of the external magnetic field, and the direction may be either upward or downward in FIG. 4.

Further, in the method of the (4) described above, as shown in FIG. 4, the method can be carried out by disposing electrodes 20 and 21 and an electrode having magnetism 22 on one surface.

The embodiment shown in FIG. 4 particularly supposes the case where a transistor device is formed by forming a gate insulating film and a gate electrode on the laminated structural body 10.

EXAMPLES (Manufacture of First Sample)

Using a magnetron sputtering apparatus, a sample having a superlattice structure was manufactured as follows.

First, an amorphous silicon layer was formed on a clean and plane glass substrate at a thickness of 5 nm.

Next, sputtering in which Sb and Te served as targets (composition ratio 2:3) was carried out, whereby an orientated layer formed of a crystal alloy layer of $Sb_2Te_3$, in which crystalline orientation of a c axis was oriented in a lamination direction, was laminated at a thickness of 5 nm.

Next, sputtering in which Ge and Te served as targets (composition ratio 1:1) was carried out by using the sputtering apparatus, whereby a second alloy layer formed of a crystal alloy layer of GeTe, in which a (111) plane of the crystals was oriented to a surface adjacent to the orientated layer, was laminated at a thickness of 1 nm using the orientated layer as a foundation.

Next, sputtering in which Sb and Te served as targets (composition ratio 2:3) was carried out on the second alloy layer by using the sputtering apparatus, whereby a first alloy layer formed of a crystal alloy layer of $Sb_2Te_3$, in which the crystalline orientation of the c axis was oriented in the lamination direction, was laminated at a thickness of 4 nm.

Subsequently, under the same condition, the three second alloy layers and the three first alloy layers were alternately laminated in this order, whereby the four second alloy layers and the four first alloy layers in total were alternately laminated on the orientated layer. The orientated layer, the first alloy layers and the second alloy layers were formed at 230° C.

As described above, a superlattice structure having the first alloy layers and the second alloy layers was manufactured.

Next, after the superlattice structure was cooled to a room temperature, two W electrodes were formed on the superlattice structure by using a metal mask by means of a sputtering method. A thickness of each of the two W electrodes was 100 nm, and a distance between the electrodes was 500 μm.

Finally, an SiN layer as an oxidation preventing layer was formed on the superlattice structure by means of the sputtering method at a thickness of 20 nm in a state where the W electrodes were exposed. A gas pressure at the time of forming the SiN layer was 0.5 Pa, and an argon gas was used as a carrier gas.

As described above, a first sample having the superlattice structure described above was manufactured.

Example 1

When a voltage was applied between the electrodes in the manufactured first sample described above at a room temperature (25° C.) while applying a voltage thereto and changing the voltage from +0.1 V to +1.0 V, a resistance therebetween was continuously measured. A resistance value showed a linear ohmic resistance at 6.0 kΩ.

This result shows a state that the first set phase and the second set phase are equally present or both of these set phases are absent. This is conjectured from another measurement result mentioned below that ferroelectricity did not appear with respect to the change in voltage by being in the former state.

Further, after an external magnetic field of a magnitude of 0.5 T was applied to one lamination direction of the superlattice structure for one minute, the resistance was measured while applying a voltage thereto and changing the voltage from +0.1 V to +1.0 V. The resistance value remained at 6.0 kΩ, and there was no change from the value before applying the external magnetic field.

From this result, it is confirmed that the first sample having the superlattice structure described above does not have a magnetic property in a state where the first sample has been simply manufactured.

Next, the temperature of the first sample was slowly raised while applying a voltage of +1.5 V between the electrodes with respect to the first sample and applying an external magnetic field of a magnitude of 0.2 T in one lamination direction of the superlattice structure. After the temperature exceeded 150° C. or higher, at which the set phase in the second alloy layer in the superlattice structure was stabilized, and was raised to 200° C., the first sample was cooled to the room temperature (hereinafter, referred to as an "initialization process"). The resistance value of the first sample, which had undergone the initialization process, was similarly measured while changing the voltage from +0.1 V to +1.0 V. The resistance value was changed from 6.0 kΩ to 2.5 kΩ at the time when +0.1 V was applied thereto.

Since the set phase has a lower resistance than that of the reset phase, it is conjectured that, after the initialization process, the set phase accounted for a larger ratio than that of the reset phase in the superlattice structure, and the resistance value thus decreased. Further, this result shows that, in a case where heat treatment is carried out and the sample is cooled to the room temperature while applying a voltage and a magnetic field, the set phase that has been electrically polarized can be kept in the superlattice structure depending upon the direction of the applied voltage even at the room temperature.

When the resistance was measured with inverting the polarity of the voltage at this time while applying a voltage thereto and changing the voltage from −0.1 V to −1.0 V with respect to the first sample in a state where the resistance value thereof was changed to 2.5 kΩ, the resistance value was restored to 6.0 kΩ from the time when −0.1 V was applied thereto. This value did not change until the time when −1.0 V was applied thereto.

From this result, it is conjectured that the resistance increased as a result that the set phase became unstable and was returned to the reset phase by applying a voltage in the opposite direction to the set phase (here, this set phase is supposed as the first set phase) in the superlattice structure that had been initialized by applying a voltage from the one direction. Further, since the reset phase is stable at the room temperature, it is conjectured that the phase transition of the reset phase, which includes the set phases in a state where the set phase had been unified to only the first set phase by means of the initialization process, to the second set phase in which the direction of the electric polarization was opposite to that of the first set phase was not achieved at a voltage of −1.0 V.

Further, when a voltage of +1.5 V was applied to the first sample in a state where the resistance value had been restored to 6.0 kΩ, the resistance value indicated 2.5 kΩ.

It is conjectured that the phase transition from the reset phase to the first set phase occurred by applying a relatively high voltage in the same direction as the direction, in which the first set phase had been initialized, to the superlattice structure in which the reset phase was stably present.

Moreover, after the external magnetic field with a magnitude of 0.2 T, which was applied for the initialization, was inverted by 180° and the inverted external magnetic field was applied to the first sample for one minute in a state where the resistance value thereof indicated 2.5 kΩ, the resistance was measured again at a voltage from +0.1 V to +1.0 V. The resistance value was changed from 2.5 kΩ to the original resistance value of 6.0 kΩ at the time when +0.1 V was applied thereto.

From this result, it is conjectured that the set phase (that is, the first set phase) became unstable and was returned to the reset phase because an effect by the ferromagnetism with respect to the direction of the external magnetic field was inverted.

The measurement result in Example 1 as described above can be concluded that the phase transition between the set phase and the reset phase is affected with respect to not only the direction of application of the voltage but also the direction of application of the external magnetic field, and thus a multiferroic property can be exerted in the first sample having the superlattice structure.

Example 2

When a voltage was applied between electrodes in the first sample, which was manufactured separately from the first sample used in Example 1, at a room temperature (25° C.) while applying a voltage thereto and changing the voltage from +0.1 V to +1.0 V, a resistance therebetween was continuously measured. A resistance value showed a linear ohmic resistance at 6.0 kΩ similarly to the measurement result in Example 1.

Further, after an external magnetic field of a magnitude of 0.5 T was applied to one lamination direction of the superlattice structure for one minute, the resistance was similarly measured while applying a voltage thereto and changing the voltage from +0.1 V to +1.0 V. The resistance value remained at 6.0 kΩ, and there was no change from the value before applying the external magnetic field similarly to the measurement result in Example 1.

Next, the temperature of the first sample was slowly raised by heating while applying only an external magnetic field of a magnitude of 0.2 T in one lamination direction of the superlattice structure. After the temperature exceeded 150° C. or higher, at which the set phase in the second alloy layer in the superlattice structure was stabilized, and was raised to 200° C., the first sample was cooled to the room temperature (hereinafter, referred to as an "initialization process"). The resistance value of the first sample, which had undergone the initialization process, was similarly measured while applying a voltage thereto and changing the voltage from +0.1 V to +1.0 V. The resistance value was changed from 6.0 kΩ to 4.0 kΩ at the time when +0.1 V was applied thereto.

From this result, it is conjectured that, although the amount of change in the resistance value is smaller (it was changed from 6.0 kΩ to 2.5 kΩ) than that by the initialization process in Example 1 in which both the voltage and the external magnetic field were applied, i.e., a kept rate of the set phase with respect to the reset phase at the room temperature is small, the set phase can be kept in the superlattice structure even at the room temperature to some extent by the initialization process with only the external magnetic field.

When the resistance was measured with inverting the polarity of the voltage at this time while applying a voltage thereto and changing the voltage from −0.1 V to −1.0 V with respect to the first sample in a state where the resistance value thereof was changed to 4.0 kΩ, the resistance value was restored to 6.0 kΩ from the time when −0.1 V was applied thereto, similarly to the measurement result in Example 1. This value did not change until the time when −1.0 V was applied thereto.

Further, when a voltage of +1.5 V was applied to the first sample in a state where the resistance value had been restored to 6.0 kΩ, the resistance value showed 4.0 kΩ.

Similarly to Example 1, it is conjectured that the phase transition from the reset phase to the set phase (first set phase) occurred by applying a relatively high voltage in the same direction as the direction, in which the first set phase had been initialized, to the superlattice structure in which the reset phase was stably present.

Moreover, after the external magnetic field with a magnitude of 0.2 T, which was applied for the initialization, was inverted by 180° and the inverted external magnetic field was applied to the first sample for one minute in a state where the resistance value thereof indicated 4.0 kΩ, the resistance was measured again at a voltage from +0.1 V to +1.0 V. Similarly to the measurement result in Example 1, the resistance value was changed from 4.0 kΩ to the original resistance value of 6.0 kΩ at the time when +0.1 V was applied thereto.

Example 3

When a voltage was applied between electrodes in the first sample, which was separately manufactured from the first samples used in Examples 1 and 2, at a room temperature (25° C.) while applying a voltage thereto and changing the voltage from +0.1 V to +1.0 V, a resistance therebetween was continuously measured. A resistance value showed a linear ohmic resistance at 6.0 kΩ similarly to the measurement results in Examples 1 and 2.

Further, when an external magnetic field of a magnitude of 0.5 T was applied to one lamination direction of the superlattice structure for one minute, the resistance was similarly measured while applying a voltage thereto and changing the voltage from +0.1 V to +1.0 V. The resistance value remained at 6.0 kΩ and there was no change from the value before the external magnetic field similarly to the measurement results in Examples 1 and 2.

Next, the temperature of the first sample was slowly raised by heating while applying only a voltage of +1.5 V between the electrodes with respect to the first sample. After the temperature exceeded 150° C. or higher, at which the set phase in the second alloy layer in the superlattice structure was stabilized, and was raised to 200° C., the first sample was cooled to the room temperature (hereinafter, referred to as an "initialization process"). The resistance value of the first sample, which had undergone the initialization process, was similarly measured while applying a voltage thereto and changing the voltage from +0.1 V to +1.0 V. The resistance value was changed from 6.0 kΩ to 3.0 kΩ at the time when +0.1 V was applied thereto.

From this result, it is conjectured that, although the amount of change in the resistance value is smaller (it was changed from 6.0 kΩ to 2.5 kΩ) than that by the initialization process in Example 1 in which both the voltage and the external magnetic field were applied, i.e., a kept rate of the set phase with respect to the reset phase at the room temperature is small, the set phase can be kept in the superlattice structure even at the room temperature to some extent by the initialization process with only the voltage, and that, in this initialization process, the kept rate can be increased compared with that in the initialization process in Example 2 in which only the external magnetic field was applied thereto.

Moreover, after the external magnetic field with a magnitude of 0.2 T was applied to the first sample in one lamination direction of the superlattice structure for one minute in a state where the resistance value thereof was changed to 3.0 kΩ, the resistance was measured again at a voltage from +0.1 V to +1.0 V. The resistance value was changed from 3.0 kΩ to the original value of 6.0 kΩ.

(Manufacture of Second Sample)

A second sample was manufactured by changing the formation of the electrodes of the first sample as follows. Namely, after two W electrodes were formed on the superlattice structure in a similar manner to that of the method of manufacturing the first sample, a TbFeCo ferromagnetic body thin film as a third electrode was formed at a thickness of 100 nm between these W electrodes by means of a sputtering method using a metal mask.

Example 4

When a voltage was applied between the W electrodes in the second sample at a room temperature (25° C.) while applying a voltage thereto and changing the voltage from +0.1 V to +1.0 V, a resistance therebetween was continuously measured. A resistance value showed a linear ohmic resistance at 6.0 kΩ similarly to the measurement results in Examples 1 to 3.

Next, when a resistance value between one of the W electrodes and the TbFeCo ferromagnetic body thin film mentioned above was similarly measured, an ohmic property was also shown at 6.0 kΩ.

Further, after an external magnetic field of a magnitude of 0.5 T was applied to one lamination direction of the superlattice structure for one minute, the resistance was similarly measured while applying a voltage thereto and changing the voltage from +0.1 V to +1.0 V. The resistance value remained at 6.0 kΩ, and there was no change from the value before applying the external magnetic field similarly to the measurement results in Examples 1 to 3.

In this state, the TbFeCo ferromagnetic body thin film as the third electrode had been magnetized. However, a result that the resistance value did not change before and after the external magnetic field was applied thereto indicates that the reset phase, which was non-magnetic, the first set phase, which had magnetism, and the second set phase, which has opposite magnetism, are present in the superlattice structure, and that the first set phase and the second set phase are present at the same amounts on the basis of an equilibrium state of thermodynamics or both of these set phases are absent after the manufacture of the superlattice structure. It is conjectured that the superlattice structure is in the former state from another measurement results, which will be explained later.

Next, the temperature of the first sample was slowly raised by heating while applying only a voltage of +1.5 V between one of the W electrodes and the TbFeCo ferromagnetic body thin film. After the temperature exceeded 150° C. or higher, at which the set phase in the second alloy layer in the superlattice structure was stabilized, and was raised to 200° C., the first sample was cooled to the room temperature (hereinafter, referred to as an "initialization process"). The resistance value of the first sample, which had undergone the initialization process, was similarly measured while applying a voltage thereto and changing the voltage from +0.1 V to +1.0 V. The resistance value was changed from 6.0 kΩ to 0.5 kΩ at the time when +0.1 V was applied thereto.

From this result, it is conjectured that, since the TbFeCo ferromagnetic body thin film as the third electrode was magnetized at the time when the magnetic field of 0.5 T was applied thereto so as to have residual magnetization and the initialization process was carried out by applying the voltage of +1.5 V while maintaining that state, the ferromagnetic body thin film was initialized in a stronger magnetic field than that of Example 1 and the resistance value thereof was decreased to 0.5 kΩ, which was further lower than 2.5 kΩ. It is thus conjectured that a larger number of the set phases than that in Example 1 were formed in the superlattice structure.

When the resistance was measured with inverting the polarity of the voltage at this time while applying a voltage thereto and changing the voltage from −0.1 V to −1.0 V with respect to the second sample in a state where the resistance value thereof was changed to 0.5 kΩ, the resistance value showed 0.5 kΩ without changing at the voltage between −0.1 V and −1.0 V, and was not restored.

Regarding this result, it is conjectured that, since the amount of the set phase (the first set phase) formed by the initialization process was much and the residual magnetization for stabilizing the set phase was maintained in the TbFeCo ferromagnetic body thin film, the set phase (the first set phase) was stable to a voltage of a certain magnitude even though an opposite voltage was applied, and the resistance value of 6.0 kΩ could thus not be restored like in Example 1.

Moreover, after the external magnetic field having a magnitude of 0.5 T was inverted by 180° and the inverted external magnetic field was applied to the second sample for one minute in a state where the resistance value thereof indicated 0.5 kΩ, the resistance was measured again while applying a voltage from +0.1 V to +1.0 V between one of the W electrodes and the TbFeCo ferromagnetic body thin film. The resistance value was changed from 0.5 kΩ to the original value of 6.0 kΩ.

From this result, it is conjectured that the set phase (the first set phase) became unstable and phase transition from the set phase to the reset phase occurred on the basis of the inversion of the direction of the magnetization of the TbFeCo ferromagnetic body thin film by applying the external magnetic field inverted by 180° thereto and further applying this external magnetic field.

Next, the resistance was measured while applying a negative voltage from −0.1 V to −1.0 V between one of the W electrodes and the TbFeCo ferromagnetic body thin film with respect to the second sample in a state where the resistance value was changed to 6.0 kΩ. The resistance value suddenly decreased to 0.5 kΩ at the time when −0.8 V was applied thereto and 0.5 kΩ was maintained up to −1.0 V thereafter.

From this result, it is conjectured that, since a spin electrical current in which the direction of magnetization had been inverted by applying the external magnetic field that had been inverted by 180° in advance flowed into the second alloy layer and thus the direction of the magnetization inside of the superlattice structure and the direction of the electric polarization of the set phase, which had been unified to the first set phase by the initialization process, were reversed (from the direction of the electric polarization of the first set phase to the direction of the electric polarization of the second set phase), phase transition from the reset phase to the second set phase easily occurred and the phase transition occurred at a voltage of −0.8 V unlike Example 1. Namely, it is conjectured that, in the treatment in present Example 4, the second set phase appeared after the initialization process through the first set phase and the reset phase. In this regard, it is conjectured that, since change in resistance was confirmed in the set phases that appeared as the first set phase and the second set phase unlike before the initialization process, the set phases had been unified to any one phase by the initialization process.

The resistance was measured while applying a negative voltage from −0.1 V to −1.0 V between one of the W electrodes and the TbFeCo ferromagnetic body thin film with respect to the second sample in a state where the resistance value was changed to 6.0 kΩ, and applying an external magnetic field with a magnitude of 0.10 T thereto in the lamination direction, that is, one direction of the upward and downward directions of the superlattice structure. Further, similar measurements were carried out while changing the magnitude of the external magnetic field from 0.15 T to 0.50 T at 0.05 T intervals.

As a result, it was found that the transition of the resistance value to 0.5 kΩ occurred at a higher negative voltage as the magnitude of the applied magnetic field is higher.

It is conjectured that, since the direction of the external magnetic field applied in this measurement was the direction to which the first set phase was induced, and conversely, the direction of the voltage applied in this measurement was the direction to which the second set phase was induced, the second set phase was hardly formed when the external magnetic field became strong, and thus a higher negative voltage was required in order to undergo phase transition from the reset phase to the second set phase.

Further, the measurement of resistance that has been carried out previously while applying the negative voltage and the external magnetic field thereto was carried out between the two W electrodes with respect to the second sample in a state where the resistance value was changed to 6.0 kΩ. As a result, approximately the same result as that in Example 1 was obtained, and steep transition of the resistance depending on the external magnetic field, which was confirmed in a case where a negative voltage was applied between one of the W electrodes and the TbFeCo ferromagnetic body thin film, was not confirmed.

From this result, it is conjectured that, in the previous measurement in which the steep transition of the resistance was confirmed, an effect of the magnetic field remaining in the TbFeCo ferromagnetic body thin film greatly affected connection between the TbFeCo ferromagnetic body thin film and the superlattice structure.

Reference Example

When a voltage was applied between electrodes (between the two W electrodes) in the first sample, which was manufactured separately from the samples used in Examples 1 to 3, at a room temperature (25° C.) while applying a voltage thereto and changing the voltage from +0.1 V to +1.0 V, a resistance therebetween was continuously measured. A resistance value showed a linear ohmic resistance at 6.0 kΩ similarly to the measurement result in Example 1.

Further, after an external magnetic field of a magnitude of 0.5 T was applied to one lamination direction of the superlattice structure for one minute, the resistance was similarly measured while applying a voltage thereto and changing the voltage from +0.1 V to +1.0 V. The resistance value remained at 6.0 kΩ, and there was no change from the value before applying the external magnetic field similarly to the measurement result in Example 1.

Next, the temperature of the first sample was slowly raised by heating while applying a voltage of +6.0 V between the electrodes with respect to the first sample and applying only an external magnetic field with a magnitude of 0.2 T in one lamination direction of the superlattice structure. After the temperature exceeded 150° C. or higher, at which the set phase in the second alloy layer in the superlattice structure was stabilized, and was raised to 200° C., the first sample was cooled to the room temperature. The resistance value of the first sample, which had undergone the heat treatment in the external magnetic field, was similarly measured while applying a voltage thereto and changing the voltage from +0.1 V to +1.0 V. The resistance value was changed from 6.0 kΩ to 1.0 kΩ at the time when +0.1 V was applied thereto.

When the resistance was measured with inverting the polarity of the voltage at this time while applying a voltage and changing the voltage from −0.1 V to −1.0 V with respect to the first sample in a state where the resistance value was changed to 1.0 kΩ, the resistance value remained at 1.0 kΩ and was not restored to 6.0 kΩ.

Further, after the external magnetic field with a magnitude of 0.2 T, which was applied for the heat treatment, was inverted by 180° and the inverted external magnetic field was applied to the first sample for one minute in a state where the resistance value thereof indicated 1.0 kΩ, the resistance was measured again while applying a voltage thereto and changing the voltage from +0.1 V to +1.0 V. The resistance value also remained at 1.0 kΩ and was not restored to 6.0 kΩ in this case.

In the measurement in Reference Example described above, the resistance value remained at a predetermined value of 1.0 kΩ even though a magnetic field was applied and/or the polarity was inverted. For this reason, it is conjectured that, in a case where a high voltage such as 6.0 V was applied thereto, the set phase, which was supposed to have a multiferroic property, disappeared by, for example, being melted together with the $Sb_2Te_3$ layer to form an alloy, and as a result, a resistance value of polycrystal with no orientation was indicated.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method of initializing a multiferroic element, the multiferroic element having a laminated structural body, the laminated structural body comprising a first alloy layer and a second alloy layer, the first alloy layer being formed by using any of antimony-tellurium, bismuth-tellurium and bismuth-selenium as a principal component, the second alloy layer being laminated on the first alloy layer, the second alloy layer being configured to undergo phase transition between a reset phase and a set phase, electric polarization being not caused in the reset phase, the electric polarization being caused in the set phase, the method comprising:

applying at least one selected from a group consisting of an electric field and a magnetic field to the multiferroic element under a temperature condition equal to or higher than a phase transition temperature of the second alloy layer, the temperature condition being applied separately from the electric field and/or the magnetic field, the second alloy layer undergoing the phase transition from the reset phase to the set phase at the phase transition temperature.

2. The method of initializing a multiferroic element according to claim 1, wherein the multiferroic element has a superlattice structure in which first alloy layers and second alloy layers are alternately laminated, each of the first alloy layers being formed by using any of compounds $Sb_2Te_3$, $Bi_2Te_3$ and $Bi_2Se_3$ each of which has an atomic composition ratio of 2:3 as a principal component among antimony-tellurium, bismuth-tellurium and bismuth-selenium, a crystalline orientation being oriented in a predetermined orientation in each of the first alloy layers, each of the second alloy layers being formed by using any of compounds germanium-tellurium and silicon-tellurium as a principal component, a crystalline orientation being oriented in a predetermined orientation in each of the second alloy layers.

3. The method of initializing a multiferroic element according to claim 1, wherein when applying the at least one selected from the group consisting of the electric field and the magnetic field to the multiferroic element a voltage in one direction is applied between an upper electrode and a lower electrode with respect to the laminated structural body and an external magnetic field is applied to a lamination direction, the upper electrode and the lower electrode being disposed at upper and lower positions of the laminated structural body in the lamination direction.

4. The method of initializing a multiferroic element according to claim 3, wherein the voltage applied is 0.25 V or less per 1 nm of a thickness in the lamination direction of the laminated structural body.

5. The method of initializing a multiferroic element according to claim 1, wherein when applying the at least one selected from the group consisting of the electric field and the magnetic field to the multiferroic element, a voltage is applied between a first electrode and a second electrode having magnetism with respect to the laminated structural body and an external magnetic field is applied to a lamination direction, the first electrode and the second electrode being disposed on one surface of the laminated structural body.

6. The method of initializing a multiferroic element according to claim 5, wherein when applying the at least one selected from the group consisting of the electric field and the magnetic field to the multiferroic element, the voltage is applied to any of between the first electrode and the second electrode and between a third electrode and the second electrode with respect to the laminated structural body and the external magnetic field is applied in the lamination direction, the third electrode being further disposed on the one surface at a position opposite to the first electrode when seen from the second electrode.

7. The method of initializing a multiferroic element according to claim 1, wherein when applying the at least one selected from the group consisting of the electric field and the magnetic field to the multiferroic element, an external magnetic field having a magnitude of 5.0 T or less is applied.

8. The method of initializing a multiferroic element according to claim 1, wherein the at least one selected from the group consisting of the electric field and the magnetic field is applied under the temperature condition that is lower than melting points of the compounds constituting the first alloy layer and the second alloy layer.

9. The method of initializing a multiferroic element according to claim 1, wherein the second alloy layer comprises germanium-tellurium.

* * * * *